United States Patent
Ta

(10) Patent No.: US 7,425,684 B2
(45) Date of Patent: Sep. 16, 2008

(54) UNIVERSAL SYSTEMS PRINTED CIRCUIT BOARD FOR INTERCONNECTIONS

(76) Inventor: Sang Henry Ta, P.O. Box 2423, Costa Mesa, CA (US) 92628

( * ) Notice: Subject to any disclaimer, the term of this patent is extended or adjusted under 35 U.S.C. 154(b) by 0 days.

(21) Appl. No.: 12/075,336

(22) Filed: Jan. 30, 2008

(65) Prior Publication Data

US 2008/0173474 A1 Jul. 24, 2008

Related U.S. Application Data

(63) Continuation-in-part of application No. 11/051,393, filed on Feb. 3, 2005.

(51) Int. Cl.
*H05K 1/00* (2006.01)
(52) U.S. Cl. ............... 174/255; 174/261; 174/262; 174/33; 439/65; 439/507
(58) Field of Classification Search ......... 174/260–266, 174/267, 268, 250, 33; 439/65, 507, 835
See application file for complete search history.

(56) References Cited

U.S. PATENT DOCUMENTS 4,720,915 A * 1/1988 Kennedy et al. ............... 29/847
5,039,824 A * 8/1991 Takashima et al. ............ 174/33
6,423,904 B1 * 7/2002 Hayami ...................... 174/255
6,423,909 B1 * 7/2002 Haynie et al. ............... 174/261
6,617,521 B1 * 9/2003 Saito et al. .................. 174/260
7,199,478 B2 * 4/2007 Jung .......................... 257/786

* cited by examiner

*Primary Examiner*—Ishwar B. Patel
*Assistant Examiner*—Hoa C Nguyen

(57) ABSTRACT

In Electronics, there exists three distinctive areas namely, discrete components or devices, circuits, and systems. A circuit is built from devices and a system is built from circuits. This invention aims at reducing the implementation of electronic systems down to just three steps namely, systems design, printed-circuit-board planar assembly, and systems test when-as a plurality of Universal Systems Printed-Circuit Blocks of pre-defined sizes is used. Each of said Universal Systems Printed-Circuit Blocks being usable and reusable for prototypes and production is built from a printed circuit board having thereon a functional circuit and a variety of circuit patterns and interconnection structures such that, any of said blocks, when joined together with other blocks on the same plane by standard connectors or electrically conductive compounds to form a systems board, can send and receive signals and voltages to and from any other blocks.

12 Claims, 1 Drawing Sheet

UNIVERSAL SYSTEMS PRINTED CIRCUIT BOARD FOR INTERCONNECTIONS

CROSS-REFERENCE TO RELATED APPLICATIONS

This application is continued in part of the parent application Ser. No. 11/051,393 filed on Feb. 3, 2005.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

In Electronics, there exists three distinctive areas namely discrete components or devices, circuits, and systems. A circuit is built from devices and a system is built from functional circuits such as voltage divider, amplifiers, comparators, oscillators, logic gate arrays, power supply. This invention relates in general to printed circuit boards and in particular to printed circuit boards having thereon one of said functional circuits and a interconnection pattern of circuit conductors and plated-through holes, so that a plurality of said particular printed circuit boards can be electrically connected and physically joined together on the same plane to form a systems printed-circuit board. Since each said systems printed circuit board can be used and reused according to this invention in any electronic systems, hence, the title of Universal Systems Printed Circuit Board being abbreviated as USPCB.

For the purpose of clarification and use, any person skilled in the art does know that a standard printed-circuit board shall have, as a minimum, edged copper conductors normally understood or called as printed wiring or circuit traces, edged copper pads normally called or understood as pads, and metallically plated-through apertures normally called or understood as plated-through holes. Therefore, terminologies of circuit trace(s), pad(s) and plated-through hole(s) are used hereinafter. Also, any person skilled in the art does know that a standard double-sided printed circuit board shall have as a minimum, a non-conductive substrate, a top copper-clad surface normally called or understood as upper surface or component side, and bottom copper-clad surface normally called or understood as lower surface or far-end side or circuit side. Therefore, terminologies of upper surface and lower surface are used hereinafter. Furthermore, any person skilled in the art does know that a standard multilayer printed-circuit board shall have as a minimum, an upper surface and lower surface, and two inner conductive layers being electrically isolated from each other by a non-conductive substrate. Said two inner conductive layers are normally used as a voltage plane and a ground plane. Therefore, terminologies of voltage plane and ground plane are used hereinafter.

It has been found from apparent applications and patent search that, heretofore, such a USPCB does not exist. U.S. Pat. No. 4,720,915 on Jan. 26, 1988 by Kennedy, and U.S. Pat. No. 4,325,780 on Apr. 20, 1982 by Schulz, and U.S. Pat. No. 6,226,862 on May 8, 2001 by Neuman, and U.S. Pat. No. 4,868,980 on Sep. 26, 1989 by Miller, and over 49 reference patents cited therewith all of them only relate to stand-alone printed circuit boards, i.e. printed circuit boards without a means for inter-board electrical connection on the same plane; additionally, U.S. Pat. No. 6,784,375 on Aug. 31, 2004 by Miyake, and U.S. Pat. No. 6,449,836 on Sep. 17, 2002 also by Miyake, and U.S. Pat. No. 4,950,527 on Aug. 21, 1990 by Yamada, and U.S. Pat. No. 3,832,603 on August 1974 by Cray all of them only relate to interconnecting printed circuit boards from different planes, such an interconnection method not only differs from the method used by this invention but also differs in the end use as described herein, furthermore, all of 48 reference patents being cited therewith have joined with the aforementioned 49 cited reference patents to also relate only to stand-alone printed circuit boards. Besides, none of said cited patents and reference patents mentions about a fully functional circuit being preinstalled on their related printed circuit board to play the role of a systems building block.

Particularly, the cited patent numbers U.S. Pat. No. 3,757,028 by Schlessel for a transmission line structure being printed on a circuit board with zig-zag line conductors for interference suppression, U.S. Pat. No. 6,617,521 by Saito et al. for a circuit board system connecting a semiconductor chip to a wiring board and then to a circuit board having printed input and output wirings, U.S. Pat. No. 5,039,824 by Takashima for pairs of conductor twisted between the two opposite surfaces of a circuit board to improve the transmission characteristics of the printed circuit in the high-frequency range, U.S. Pat. No. 6,423,909 by Haynie et al. for patterns of differential bus traces to interconnect electronic devices and cables together in order to mimic the size and configuration of the devices and to reduce crosstalk between channels, U.S. Pat. No. 6,423,904 by Hayami for a circuit board structured with printed wirings on both sides of the board and moving the wirings closed together with conductive blind through-hole to reduce wiring area and noise, U.S. Pat. No. 7,199,478 by Jung for a circuit board with lands patterns to improve the integration of peripheral chip mounted thereon and secure a fine soldering state, and finally, U.S. Pat. No. 4,720,915 by Kennedy for a printed circuit board preset with pre-defined pads and traces which are then re-etched and masked differently for each circuit application, are not only different in utility as compared to the invention hereunder but also different in the way the plated through holes are arranged and the printed wirings are connected. Specifically, the hole patterns and interconnection structure of this invention are aimed at interconnecting on-board discrete components to form an individual circuit board with a fully functional circuit thereon, and interconnecting the individual boards together to form a complete systems circuit board.

The printed wirings of this invention are not twisted together, or transversely moved closer by Schlessel, Haynie, or Hayami, nor connected to just a single semiconductor chip or peripheral chip by Saito and Jung. Additionally, none of the cited References provides means to cross connect circuit traces and plated through holes on the circuit board with jumping connectors.

SUMMARY OF THE INVENTION

In electronics engineering, electronic systems or products are implemented first by a circuit design then a systems design followed by discrete-components purchasings, breadboardings, tests, printed circuit board designs, printed circuit board fabrications, printed circuit board assembly, and systems tests. This invention aims at reducing said implementation of electronic systems down to just three steps, namely, systems design, printed circuit board assembly, and systems test when-as a plurality of Universal Systems Printed-Circuit Boards or USPCB described hereinafter are used.

It is the primary objective of this invention to create a unique pattern of plated-through holes and circuit traces on a standard printed-circuit board in such a way that, a functional circuit when installed thereon can send and receive a plurality of electrical signals to and from other circuits when installed on other printed circuit boards of the same design and size or of multiple of said size.

It is also the primary objective of this invention to create a printed-circuit block by installing a functional circuit on the aforementioned printed-circuit board, in as much like a functional block of a block diagram.

Finally, it is the primary objective of this invention to create a piecewise systems printed-circuit board wherein, each piece is a printed circuit block being joined together on the same plane by preferred means of low-cost edge connectors and/or electrically conductive jumping compound.

BRIEF DESCRIPTION OF THE DRAWINGS

The novel features believed characteristic of the invention are set forth in the appended claims. The invention itself, however, as well as a preferred mode of use, will best be understood by reference to the following detailed description of an illustrative embodiment when read in conjunction with the accompanying drawings, wherein:

Figure 1:
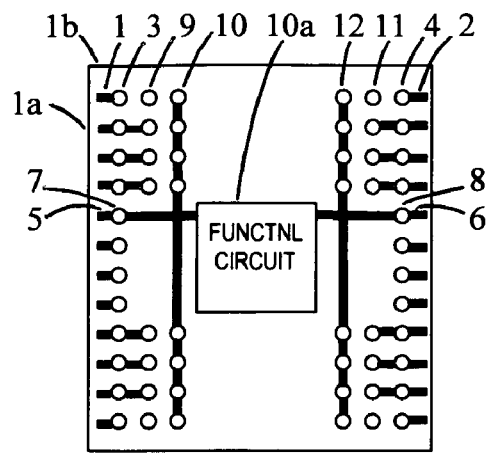
FIG. 1 depicts an enlarged plan view of the upper surface of a common USPCB which comprises a multilayer printed circuit board for surface-mounted components, a plurality of circuit components preinstalled thereon, and a pattern of circuit traces and plated through holes being arranged in such a way that the circuit on the USPCB can receive input signals and power from adjacent USPCB's, and send output signals and power to following USPCB's.
Figure 2:
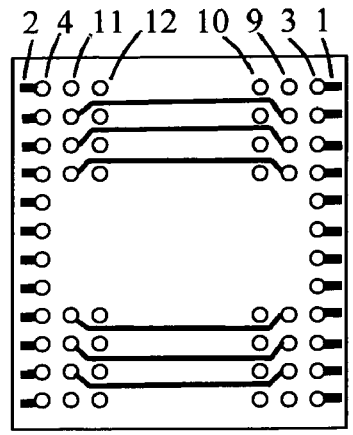
FIG. 2 depicts an enlarged plan view of the lower surface of the USPCB in FIG. 1.
Figure 3:
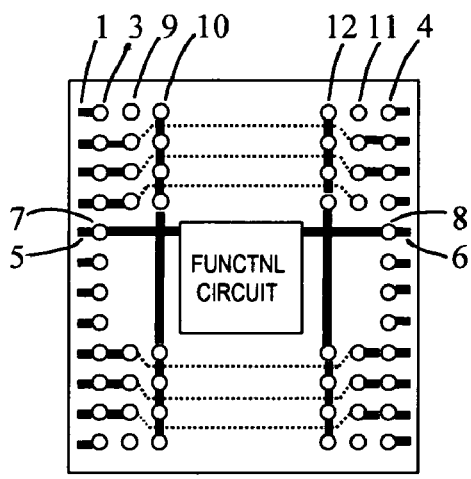
Figure 4:
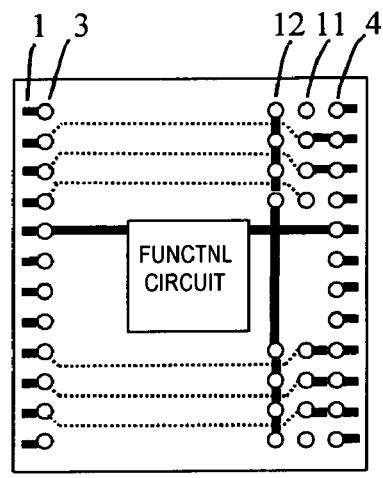
Figure 5:
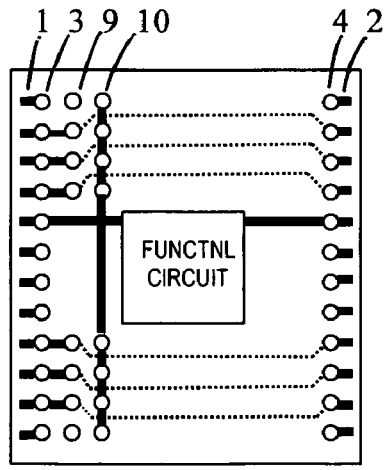

In order to have an overall picture of the board layout, circuit traces on the lower surface of the USPCB will be shown as dotted lines on all figure drawings hereinafter;

FIG. 3 depicts an enlarged view of both surfaces shown in FIG. 1 and FIG. 2 wherein, circuit traces on the lower surface are shown in dotted lines;

FIG. 4 depicts an enlarged view of a simple USPCB which only needs one input signal;

FIG. 5 depicts still another simple USPCB which still needs inputs as the USPCB in FIG. 1 but does not send any signals to the output terminals, or sends out only one signal on just a single line;

DETAIL DESCRIPTION OF THE PREFERRED EMBODIMENTS

Printed circuit boards used for the USPCB are of conventional multilayer type comprising as a minimum, a non-conductive substrate, an upper surface, a lower surface, a plurality of circuit traces, a plurality of circuit pads and a plurality of plated-through holes. For noise-sensitive circuits, two inner conductive layers are added, one of said two layers is used as a ground plane and the other as a voltage plane. Said plated through holes are used to interconnect circuit traces between said layers.

With reference now to the FIGURES and in particular with reference to FIG. 1, there is depicted an enlarged plan view of the upper surface of a most common USPCB. FIG. 2 depicts a plan view of the bottom surface of said USPCB, and FIG. 3 depicts a plan view of both surfaces wherein, circuit traces on the bottom surface are shown in dotted lines. Referring to all three figures, a USPCB has a height $1a$ of fixed length or a multiple of fixed length, a width $1b$ of fixed length or a multiple of fixed length, and a pattern of connection wherein, trace terminals in column 1 are electrically connected to plated through holes on the same row in columns 3, 9, 11, 4 and to trace terminals in column 2 with a plurality of circuit traces; plated through holes in column 9 can be electrically connected to plated through holes in column 10 and plated through holes in columns 11 can be electrically connected to plated through holes in column 12 by permanent or temporary pin jumpers or electrically conductive jumping compounds.

The aforementioned pattern of circuit traces, plated through holes and connection along the top edge of the USPCB are repeated in a plurality of rows starting from the row beginning with the second plate-through hole in the third column all the way down to the row beginning with the plated-through hole just above the bottom plated-through hole in the third column. Trace terminals in the fifth column are electrically connected each to adjacent plated-through holes in the seventh column and are used for signal inputs, signal ground, supply voltage, and power ground. Trace terminals in the sixth column are electrically connected each to adjacent plated-through holes in the eighth column and are used for signal outputs, signal ground, supply voltage, and power ground. All plated through holes in column 10 are electrically connected to each other and to the circuit $10a$, and also to one of the plated through holes in the seventh column being used for signal inputs. All plated through holes in column 12 are electrically connected to each other and to the signal output line of circuit $10a$, and also to one of the plated through holes in the eighth column being used for the signal outputs, so that a same output can be sent to a plurality of USPCB's by selectively and electrically connecting column 12 to one or more plated through holes in column 11. When a USPCB does not receive an electrical signal from an adjacent USPCB but from other USPCB's, plated through holes in column 10 will be jumped to one of the plated through holes in column 9. Additionally, when a USPCB needs to send out a plurality of signals to other USPCB's, plated through holes in column 12 will by jumped to adjacent plated through holes in column 11.

Referring to FIGS. 1 and 4, columns 9 and 10 may not exist. With this arrangement, plated through holes in column 3 are electrically connected directly on the same row to plated through holes in columns 11 and 4.

Referring to FIGS. 1 and 5, columns 11 and 12 may not exit. With this arrangement, plated through holes in column 4 are electrically connected directly on the same row to plated through holes in columns 3 and 9.

As a variation, the position of column 9 can be interchanged with the position of column 10 and the position of column 11 can be interchanged with the position of column 12 without affecting the electrical interconnection structure. Furthermore, if n is the number of plated through holes in columns 3, 4, 9 and 11, hole number 2 of column 10 can be changed to electrically connect to hole number 1 of column 3 or 9, hole number (n−1) of column 10 can be changed to electrically connect to hole number n of column 3 or 9, hole number 2 of column 12 can be changed to electrically connect to hole number 1 of column 4 or 11, and hole number (n−1) of column 12 can be changed to electrically connect to hole number 1 of column 4 or 11.

The invention is claimed as follows:

1. An interconnections system between printed circuit boards (PCB) comprising: A plurality of printed circuit boards; wherein each of said printed circuit boards comprising a first column of n circuit trace terminals placed very close to the left edge of the board, where n at least equals to 4;

a second column of n circuit trace terminals placed very close to the right edge of the board and on the same rows with the circuit traces terminals in said first column;

a third column of n plated through holes, wherein each plated through hole is placed next to the right of and in electrical contact with each circuit trace terminal on the same row in said first column;

a fourth column of n plated through holes, wherein each plated through hole is placed next to the left of and in electrical contact with each circuit trace terminal on the same row in said second column;

a fifth column of m circuit-trace terminals placed in the same column with said first column;

a sixth column of m circuit trace terminals placed in the same column with said second column;

a seventh column of m plated through holes placed in the same column with said third column, wherein each hole is placed next to the right of and in electrical contact with each circuit-trace terminal on the same row in said fifth column, and one hole may be used as an input-signal hole and the other holes may be used for power-supply connections;

an eight column of m plated through placed in the same column with said fourth column, wherein each hole is placed next to the left of and in electrical contact with each circuit-trace terminal on the same row in said sixth column, and one hole may be used as an output-signal hole and the other holes may be used for power-supply connections;

wherein m is greater than zero;

a ninth column of n plated through holes, wherein each of the holes from number 2 to number (n–1) is electrically connected to the hole of the same order number in said third column with a circuit trace, which is not in electrical contact with the holes and circuit traces in any other columns;

a tenth column of n plated through holes, wherein each of the holes from number 2 to number (n–1) are electrically connected together by a plurality of circuit traces which are also electrically connected directly or indirectly via jumping connectors to the input-signal hole in said seventh column;

an eleventh column of n plated-through holes, wherein each of the holes from number 2 to number (n–1) is electrically connected to the hole of the same order number in said fourth column with a first circuit trace and to the hole on the same row in said ninth column with a second circuit trace, said first circuit trace and said second circuit trace are not in electrical contact with the holes and circuit traces in any other columns;

a twelfth column of n plated-through holes, wherein each of the holes from number 2 to number (n–1) are electrically connected together by a plurality of circuit traces which are also electrically connected directly or indirectly via jumping connectors to the output-signal hole in said eight column;

a first group and a second group of circuit traces for connecting between said plated through hole in each of said columns; and at least one pad formed around each hole of said plated through holes in each of said columns.

2. The printed circuit board of claim 1, wherein said first group of circuit traces electrically connects the hole number 2 in said tenth column to the hole number 1 in said ninth column, and the hole number n–1 in said tenth column to the hole number n in said ninth column.

3. The printed circuit board of claim 1, wherein said first group of circuit traces electrically connects the hole number 2 in said tenth column to the hole number 1 in said third column, and the hole number n–1 in said tenth column to the hole number n in said third column.

4. The printed circuit board of claim 1, wherein said second group of circuit traces electrically connects the hole number 2 in said twelfth column to the hole number 1 in said eleventh column, and the hole number n–1 in said twelfth column to the hole number n in said eleventh column.

5. The printed circuit board of claim 1, wherein said second group of circuit traces electrically connects the hole number 2 in said twelfth column to the hole number 1 in said fourth column, and the hole number n–1 in said twelfth column to the hole number n in said fourth column.

6. The printed circuit board of claim 1, wherein the number of plated through holes in said ninth column is less than or equal to n.

7. The printed circuit board of claim 1, wherein the number of plated through holes in said eleventh column is less than or equal to n.

8. The printed circuit board of claim 1, wherein said first group of circuit traces electrically connects the hole number 2 in said tenth column to the hole number 1 in said tenth column, and the hole number n–1 in said tenth column to the hole number n in said tenth column, and wherein said second group of circuit trace electrically connects the hole number 2 in said twelfth column to the hole number 1 in said twelfth column, and the hole number n–1 in said twelfth column to the hole number n in said twelfth column.

9. The printed circuit board of claim 1, wherein the number of plated through holes in said ninth column and said eleventh column is less than or equal to n.

10. The printed circuit board of claim 1, wherein said ninth column and said tenth columns can be removed or disconnected, and in such arrangement the plated through holed in third column are electrically connected directly on the same row to the plated through holes in eleventh and fourth columns.

11. The printed circuit board of claim 1, wherein said eleventh column and said twelfth column can be removed or disconnected and in such arrangement the plated through holes in fourth column are electrically connected directly on the same row to the plated through holes in the third and ninth columns.

12. The printed circuit board of claims 1 to 11, wherein one or more circuit trace terminals in said first column, said second column, said fifth column, and said sixth column can be removed or disconnected.

* * * * *